United States Patent
Pyeoun

(10) Patent No.: US 9,136,294 B1
(45) Date of Patent: Sep. 15, 2015

(54) IMAGE SENSOR HAVING PHASE DIFFERENCE DETECTION PIXEL

(71) Applicant: SK hynix Inc., Gyeonggi-do (KR)

(72) Inventor: Chang-Hee Pyeoun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/542,170

(22) Filed: Nov. 14, 2014

(30) Foreign Application Priority Data

Sep. 3, 2014 (KR) .................. 10-2014-0116949

(51) Int. Cl.
*H01L 31/00* (2006.01)
*H01L 27/146* (2006.01)

(52) U.S. Cl.
CPC ...... *H01L 27/1462* (2013.01); *H01L 27/14621* (2013.01); *H01L 27/14623* (2013.01); *H01L 27/14625* (2013.01)

(58) Field of Classification Search
CPC ............. H01L 27/1462; H01L 27/14625; H01L 27/14623; H01L 27/14621
See application file for complete search history.

(56) References Cited

U.S. PATENT DOCUMENTS 8,168,938 B2   5/2012   Toda
8,772,892 B2   7/2014   Okigawa

*Primary Examiner* — Long Pham
(74) *Attorney, Agent, or Firm* — IP & T Group LLP

(57) ABSTRACT

An image sensor includes: a photoelectric conversion layer; and a pixel lens, including a plurality of light condensing layers, formed over the photoelectric conversion layer, wherein upper layers of the plurality of light condensing layers have shorter widths than lower layers of the plurality of light condensing layers, wherein the light condensing layers of the pixel lens have their sidewalls of one side aligned with each other.

18 Claims, 4 Drawing Sheets

IMAGE SENSOR HAVING PHASE DIFFERENCE DETECTION PIXEL

CROSS-REFERENCE TO RELATED APPLICATIONS

The present application claims priority of Korean Patent Application No. 10-2014-0116949, filed on Sep. 3, 2014, which is herein incorporated by reference in its entirety.

BACKGROUND

1. Field

Exemplary embodiments relate to semiconductor device fabrication technology, and more particularly, to an image sensor including phase difference detection pixels.

2. Description of the Related Art

Phase difference detection in image sensors is carried out using a pair of pixels. Each of the pixels includes a structure that blocks light. This structure is disposed in an upper portion of a photoelectric conversion layer so that only light coming from a particular direction may enter the image sensor. When out of focus, there is a phase difference in the output of the pair of pixels. With phase difference measuring technique, it is possible to fabricate a camera that automatically adjusts focus without an auto-focusing (AF) sensor module.

According to existing technology, however, the phase difference detection pixels have a decreased amount of external signal inputted from outside of the image sensor due to the light blocking structure.

SUMMARY

An embodiment of the present invention is directed to an image sensor including phase difference detection pixels that may prevent a decrease in the amount of external signals inputted from outside of the image sensor.

In accordance with an embodiment of the present invention, an image sensor includes: a photoelectric conversion layer; and a pixel lens, including a plurality of light condensing layers, formed over the photoelectric conversion layer, wherein upper layers of the plurality of light condensing layers have shorter widths than lower layers of the plurality of light condensing layers, wherein the light condensing layers of the pixel lens have their sidewalls of one side aligned with each other.

The image sensor may further include: a filter layer formed over or under the pixel lens. The plurality of light condensing layers may have the same shape. Each of the plurality of light condensing layers may be in a polygon shape, in a circle shape, or in an oval shape. The upper layers of the plurality of light condensing layers of the pixel lens may have a shorter width than the lower layers of the plurality of light condensing layers in a direction (which is referred to as 'a first direction', hereafter) toward the aligned sidewalls from centers of the plurality of light condensing layers, and wherein the upper layers of the plurality of light condensing layers of the pixel lens may have a shorter width than or the same width as the lower layers of the plurality of light condensing layers in a second direction that intersects with the first direction. The lowermost light condensing layer among the plurality of light condensing layers may be the same as or greater than the photoelectric conversion layer in width (or area).

In accordance with another embodiment of the present invention, an image sensor includes: a pixel array where a plurality of pixels, including at least a pair of phase difference detection pixels, are arranged, wherein each of the pair of phase difference detection pixels comprises: a photoelectric conversion layer; and a pixel lens, including a plurality of light condensing layers, formed over the photoelectric conversion layer, wherein upper layers of the plurality of light condensing layers have shorter widths than lower layers of the plurality of light condensing layers, wherein first sidewalls of the plurality of light condensing layers are aligned with each other, and wherein the pair of the phase difference detection pixels include a first pixel and a second pixel, wherein the first pixel and the second pixel are arranged so that the aligned first sidewalls of the plurality of light condensing layers of the first pixel face against the aligned first sidewalls of the plurality of light condensing layers of the second pixel.

Each of the pair of the phase difference detection pixels may further include: a filter layer formed over or under the pixel lens. The filter layer of the first pixel may be the same as the filter layer of the second pixel. The upper layers of the plurality of light condensing layers of the pixel lens may have a shorter width than the lower layers of the plurality of light condensing layers in a direction (which is referred to as 'a first direction', hereafter) toward the aligned first sidewalls from centers of the plurality of light condensing layers, and wherein the upper layers of the plurality of light condensing layers of the pixel lens may have a shorter width than or the same width as the lower layers of the plurality of light condensing layers in a second direction that intersects with the first direction. Second sidewalls of the plurality of light condensing layers may form a step structure, and the second sidewalls may be located opposite to the first sidewalls. The lowermost light condensing layer among the plurality of light condensing layers may be the same as or greater than the photoelectric conversion layer in width (or area). The first pixel and the second pixel may be disposed adjacent to each other or spaced apart from each other, and wherein the first pixel and the second pixel may be disposed in the same row or the same column in the pixel array. The first pixel and the second pixel may be disposed to be adjacent to each other or spaced apart from each other, and wherein the first pixel and the second pixel may be disposed in different rows or different columns in the pixel array.

In accordance with another embodiment of the present invention, an image sensor includes: a pixel array where a plurality of pixels, including at least a pair of phase difference detection pixels, are arranged, wherein the pair of the phase difference detection pixels comprises a first pixel and a second pixel, and each of the first pixel and the second pixel comprises: a photoelectric conversion layer; and a pixel lens, including a plurality of light condensing layers, formed over the photoelectric conversion layer, wherein upper layers of the plurality of light condensing layers are shorter in widths than lower layers of the plurality of light condensing layers, wherein the plurality of light condensing layers are disposed in an eccentric manner with respect to each other, and wherein the first pixel and the second pixel face against each other.

The sidewalls of the plurality of light condensing layers of each of the first and the second pixels may be disposed close to each other in a first direction extending from centers of the light condensing layers toward sidewalls of the light condensing layers.

In accordance with another embodiment of the present invention, an image sensor includes: a first photoelectric conversion layer; and a first pixel lens, including a first plurality of light condensing layers, formed over the first photoelectric conversion layer, wherein respective upper layers of the first plurality of light condensing layers are smaller in area than lower layers of the first plurality of light condensing layers, and wherein first sidewalls of the first plurality of light condensing layers may be aligned with each other along a vertical direction perpendicular to an upper surface of the first photoelectric conversion layer.

The image sensor may further comprising: a second photoelectric conversion layer; and a second pixel lens, including a second plurality of light condensing layers, formed over the second photoelectric conversion layer, wherein upper layers of the second plurality of light condensing layers are smaller in area than lower layers of the second plurality of light condensing layers, wherein the 10 second pixel lens and the first pixel lens form a mirror image with respect to each other.

DETAILED DESCRIPTION

Figure 1:
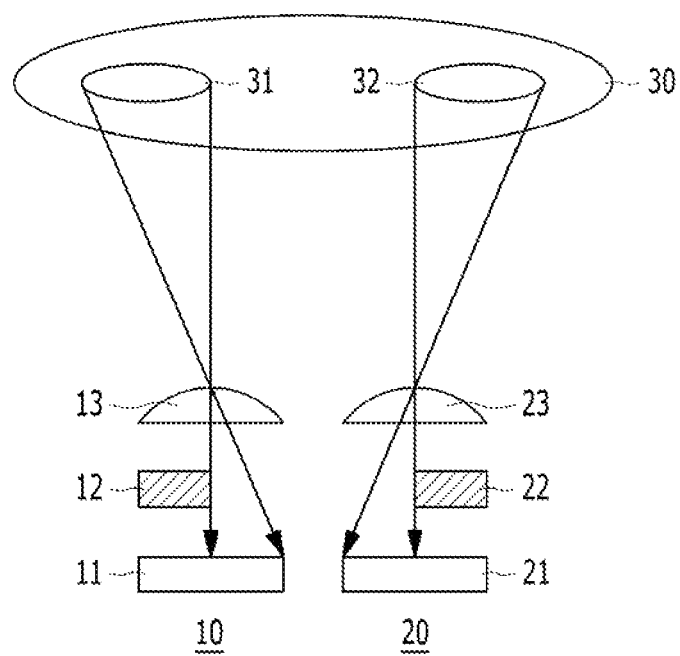
FIG. 1 illustrates general phase difference detection pixels.

Exemplary embodiments will be described below in more detail with reference to the accompanying drawings. However, the embodiments should not be construed as limited to the specific shapes shown in the drawings. Throughout the disclosure, like reference numerals refer to like parts throughout the various figures and embodiments.

The drawings are not necessarily to scale and, in some instances, proportions may have been exaggerated in order to clearly illustrate features of the embodiments. When a first layer is referred to as being "on" a second layer or "on" a substrate, it not only refers where the first layer is formed directly on the second layer or the substrate but also to where a third layer exists between the first layer and the second layer or the substrate.

The following embodiment describes an image sensor including phase difference detection pixels. To be specific, the embodiment provides an image sensor including phase difference detection pixels that address a performance deterioration issue caused by a shading mask of a conventional image sensor. The shading mask blocks off a significant amount of incident light. Since only part of the incident light may arrive at a photoelectric conversion layer to detect a phase difference, performance of the image sensor deteriorates.

First, the basic principles of how a phase difference is detected in a general phase difference detection pixels including a shading mask will be described.

FIG. 1 illustrates general phase difference detection pixels.

Referring to FIG. 1, the phase difference detection pixels for detecting a phase difference requires a first pixel 10 and a second pixel 20. Each of the first pixel 10 and the second pixel 20 includes a photoelectric conversion layer 11 and 21, a shading mask 12 and 22, and a micro lens 13 and 23. The shading mask 12 and 22 may block part of incident light from entering the photoelectric conversion layer 11 and 21. For example, the shading mask 12 and 22 may allow only half of incident light to arrive at the photoelectric conversion layer 11 and 21.

The incident light penetrates through the micro lens 13 and 23 and is guided into the first pixel 10 and the second pixel 20, each of which has a photoelectric conversion layer 11 and 21. Each of the first pixel 10 and the second pixel 20 has an opening that restricts a pupil 31 and 32 from the imaging lens 30. The opening is defined by the shading masks 12 and 22 that restrict pupils 31 and 32 from the imaging lens 30. The incident light passing through the pupils 31 and 32 of the imaging lens 30 arrives at the first pixel 10 and the second pixel 20 by further passing through the shading masks 12 and 22. The shading masks 12 and 22 are called 'pupil division'.

The pupil-divided outputs of the first pixel 10 and the second pixel 20 are compared with each other. The pupil-divided outputs have the same shape but the outputs have different phases, depending on position. This is because the focal positions of the incident light entering through the pupils 31 and 32 of the imaging lens 30 are different. By using the different outputs, i.e., a phase difference, of the first pixel 10 and the second pixel 20, it is possible to perform auto-focusing, measure focal length, and realize a three-dimensional image.

Herein, the phase difference detection pixels including the shading masks 12 and 22 block a portion of incident light entering the photoelectric conversion layers 11 and 21, there is a shortcoming in that a significant amount of signal entering from outside are blocked and may not arrive at the first pixel 10 and the second pixel 20. Also, there is another issue in that the phase difference detection pixels do not perform normal operations in a low illumination environment or when the phase difference detection pixels are positioned in the edge of a pixel array where a plurality of pixels are arranged in two dimensions. When the signals of the neighboring pixels are used that are disposed adjacent to the phase difference detection pixels in order to improve the problem, the overall focus value calculation time is delayed, which is problematic as well. Also, since a process for forming the shading masks 12 and 22 has to be performed, productivity is deteriorated.

To address these issues, an embodiment provides phase difference detection pixels capable of guiding incident light of a particular direction into a photoelectric conversion layer without using a shading mask. To this end, each of the phase difference detection pixels in accordance with an embodiment adopts a pixel lens which includes a plurality of light condensing layers instead of a shading mask. Upper layers of the light condensing layers have shorter widths (or smaller area) than lower layers of the light condensing layers. The light condensing layers are disposed eccentrically toward one side. Sidewalls of the light condensing layers may be aligned with each other. The light condensing layers may be arranged in an eccentric manner with each other.

Figure 2:
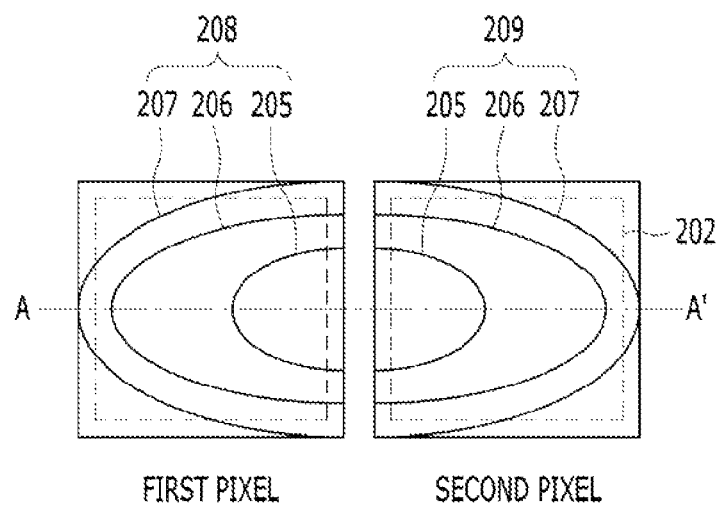
FIG. 2 is a plan view illustrating phase difference detection pixels in accordance with an embodiment.
Figure 3:
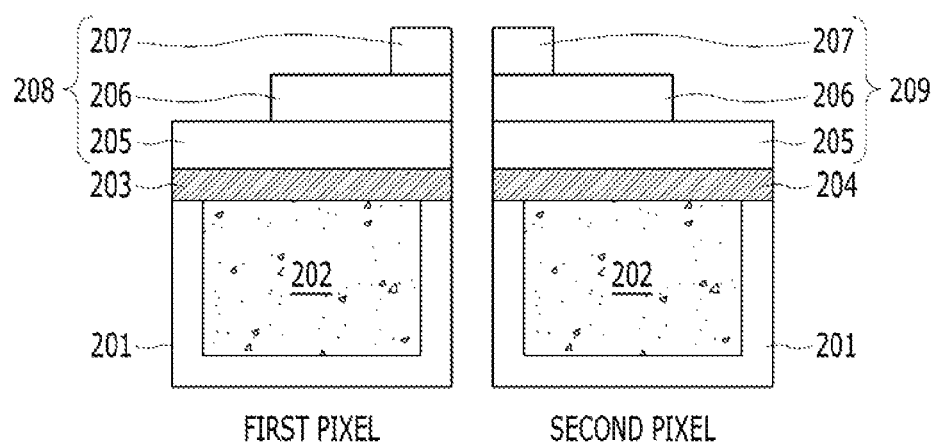
FIG. 3 is a cross-sectional view of the phase difference detection pixels taken along the A-A' line shown in FIG. 2.
Figure 4A:
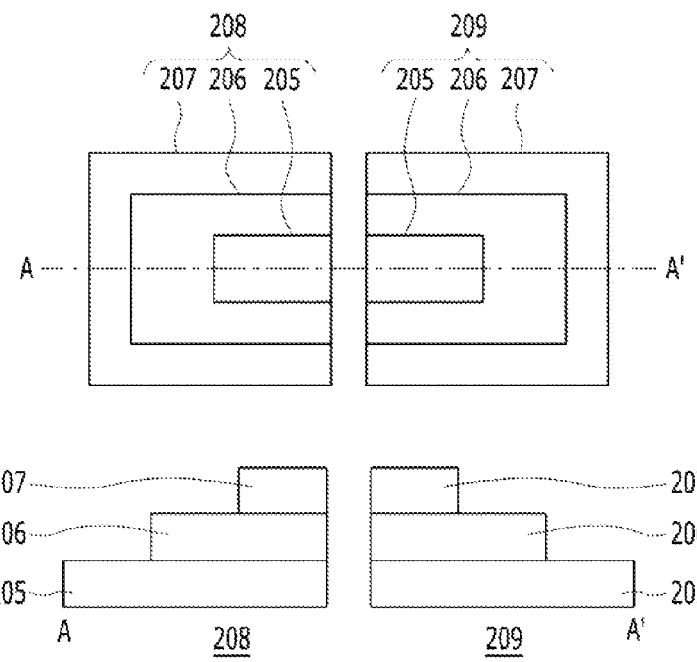
FIGS. 4A to 4C illustrate pixel lenses in the phase difference detection pixels in accordance with an embodiment.
Figure 4B:
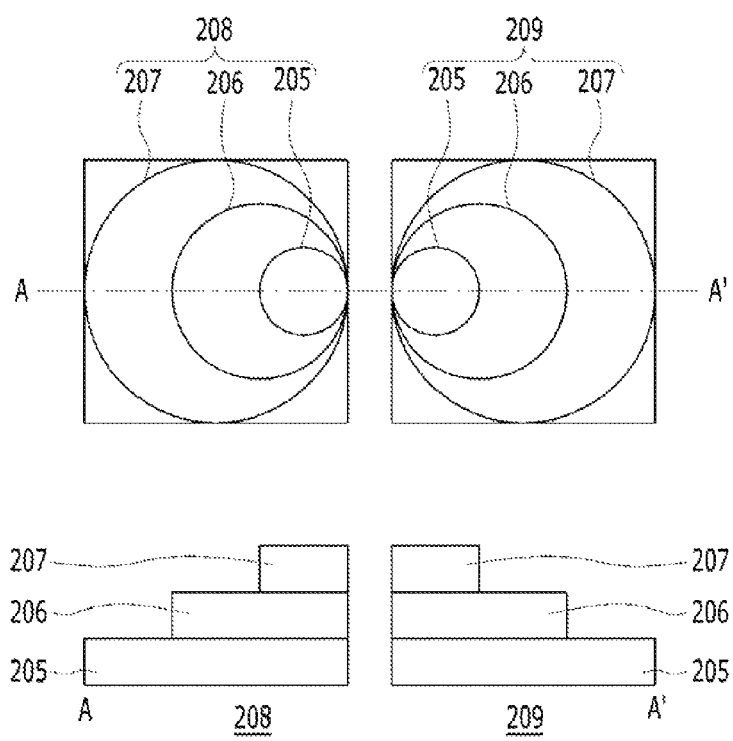
Figure 4C:
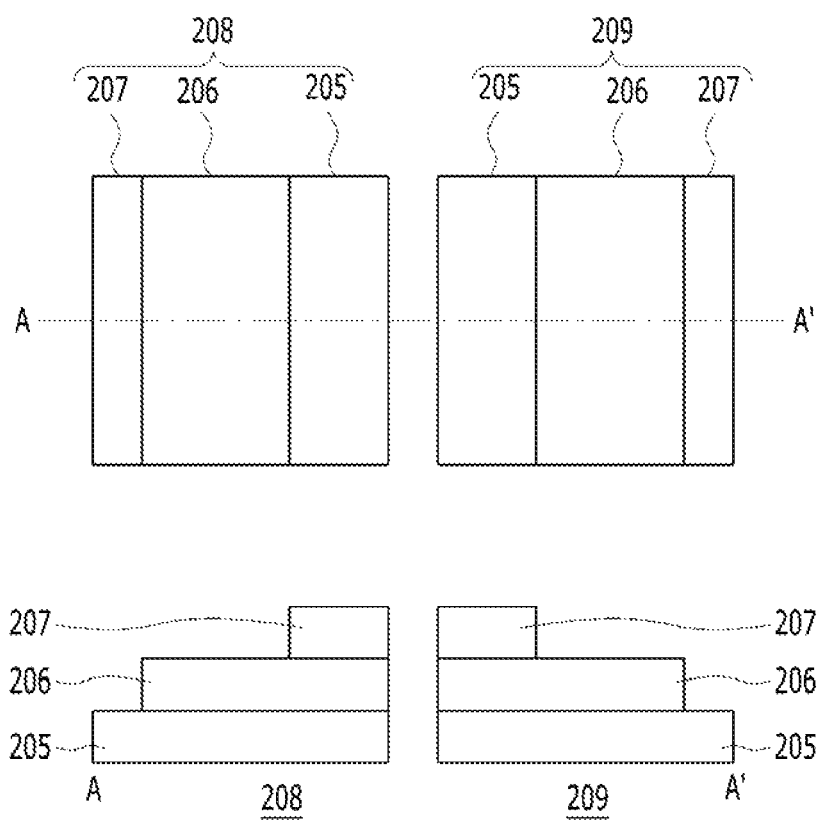

FIG. 2 is a plan view illustrating phase difference detection pixels in accordance with an embodiment. FIG. 3 is a cross-sectional view of the phase difference detection pixels taken along an A-A' line shown in FIG. 2. Each of FIGS. 4A to 4C illustrates pixel lenses in the phase difference detection pixels in accordance with an embodiment.

Referring to FIGS. 2 to 4C, the image sensor in accordance with an embodiment may include a pixel array where a plurality of pixels is arranged in two dimensions. The pixels may include a plurality of color detection pixels for realizing a color image and a plurality of phase difference detection pixels for measuring a focal length and realizing auto-focusing and a three-dimensional image.

The phase difference detection pixels may include a pair of pixels that receives incident light entering from different directions. A pair of phase difference detection pixels functions as a unit pixel. To be specific, a unit pixel for detecting a phase difference may include a first pixel and a second pixel. The first pixel and the second pixel may be disposed adjacent to each other or spaced apart from each other and may be disposed in the same row or column of the pixel array. Also, the first pixel and the second pixel may be disposed adjacent to each other or spaced apart from each other and may be disposed in different rows or columns of the pixel array.

The phase difference detection pixels in accordance with an embodiment may include pixel lenses 208 and 209, respectively. Each of the pixel lenses 208 and 209 may include a photoelectric conversion layer 202 and a plurality of light condensing layers 205, 206 and 207 disposed over the photoelectric conversion layer 202. The upper layers of the light condensing layers 205, 206 and 207 have shorter widths than the lower layers of the light condensing layers 205, 206 and 207.

The photoelectric conversion layer 202 may be formed in a substrate 201. The photoelectric conversion layer 202 formed in a substrate 201 may include a plurality of photoelectric converters that vertically overlap with each other. Each of the photoelectric converters may be a photodiode including an N-type impurity region and a P-type impurity region. The substrate 201 may be a semiconductor substrate and include a monocrystalline silicon-containing material.

The pixel lenses 208 and 209 condense incident light entering the photoelectric conversion layer 202. To this end, each of the pixel lenses 208 and 209 may be a stack structure of a plurality of light condensing layers 205, 206 and 207. Among the plurality of light condensing layers 205, 206 and 207, upper layers may have shorter widths (or area) than the lower layers. For example, the pixel lenses 208 and 209 may include the light condensing layer 205, the light condensing layer 206 disposed over the light condensing layer 205 and having a shorter width (or area) than the light condensing layer 205, and the light condensing layer 207 disposed over the light condensing layer 206 and having a shorter width than the light condensing layer 206. The width (or area) of the light condensing layer 205, which is the lowermost layer, may be the same as or greater than the width (or area) of the photoelectric conversion layer 202. This configuration is advantageous in maximizing a light receiving area of the photoelectric conversion layer 202 in each pixel. The widths (or areas) and thicknesses of the light condensing layers 205, 206 and 207 may be adjusted according to the required light condensing characteristics. The light condensing layers 205, 206 and 207 may include oxide, nitride, oxynitride, or a combination thereof. The light condensing layers 205, 206 and 207 may be formed of the same material or different materials.

In the pixel lenses 208 and 209 in the phase difference detection pixels, the light condensing layers 205, 206 and 207 may have their sidewalls on one side to be aligned with each other. To rephrase, first sidewalls of the light condensing layers 205, 206 and 207 may be aligned with each other. Second sidewalls of the light condensing layers 205, 206 and 207 may form a step structure. The second sidewalls may be located opposite to the first sidewalls. The light condensing layers 205, 206 and 207 having their first sidewalls aligned with each other may be disposed close to each other. The first pixel and the second pixel face against each other. In FIG. 3, the light condensing layers 205, 206 and 207 of the pixel lenses 208 and 209 are arranged in eccentric manner. The pixel lens 208 of the first pixel and the pixel lens 209 of the second pixel are arranged to face each other. The light condensing layers 205, 206 and 207 of the pixel lenses 208 and 209 may be arranged in a mirror image.

The light condensing layers 205, 206 and 207 of the pixel lenses 208 and 209 may be in the same shape. For example, each of the light condensing layers 205, 206 and 207 may be in a rectangle shape (see FIGS. 4A and 4C), in another polygonal shape, e.g., a hexagon, in a circle shape (see FIG. 4B), in an oval shape (see FIG. 2), and the like. The upper layers of the light condensing layers 205, 206 and 207 of each pixel lens 208 or 209 may have shorter widths (or areas) than the lower layers of the light condensing layers 205, 206 and 207 when the widths are measured along a first direction extending from the centers of the light condensing layers 205, 206 and 207 toward the aligned sidewalls. See FIG. 4A. In another embodiment, the upper layers of the light condensing layers 205, 206 and 207 of each pixel lens 208 or 209 may be smaller in diameter than the lower layers of the light condensing layers 205, 206 and 207. See FIG. 4B.

Also, the upper layers of the light condensing layers 205, 206 and 207 of each pixel lens 208 or 209 may have shorter widths than (see FIGS. 2, 4A and 4B) or the same width as (see FIG. 4C) the lower layers of the light condensing layers 205, 206 and 207 when the widths are measured along a second direction perpendicular to the first direction. See FIG. 4C. The phase difference detection pixels in accordance with an embodiment may further include filter layers 203 and 204 formed in a lower portion or an upper portion of the pixel lenses 208 and 209, respectively. In FIG. 3, the filter layers 203 and 204 are formed in lower portions of the pixel lenses 208 and 209, respectively. The filter layers 203 and 204 may be band pass filters that pass only incident light with a particular wavelength band. Therefore, each of the filter layers 203 and 204 may function as a color filter or an infrared ray filter. The filter layer 203 of the first pixel and the filter layer 204 of the second pixel may be the same in size, in shape, in material, in structure or in any combination thereof, to prevent a signal difference from being caused by the filter layers 203 and 204.

Since the phase difference detection pixels in accordance with an embodiment includes the pixel lenses 208 and 209 that includes a plurality of light condensing layers 205, 206 and 207, upper layers of the plurality of light condensing layers 205, 206 and 207 have shorter widths (or areas) than the lower layers, respectively. The light condensing layers 205, 206 and 207 of each pixel lens 208 and 209 have first sidewalls aligned to each other, the phase difference detection pixels may selectively pass incident light of a particular direction to the photoelectric conversion layer 202 without using a conventional shading mask. Therefore, it is possible to prevent issues involving use of a shading mask. For example, a decrease in signal strength can be prevented.

While embodiments are described with respect to specific shapes and configurations as shown in the drawings, it should be understood that various changes and modifications in shape and configuration may be possible.

What is claimed is:

1. An image sensor, comprising:
    a photoelectric conversion layer; and
    a pixel lens, including a plurality of light condensing layers, formed over the photoelectric conversion layer,
    wherein upper layers of the plurality of light condensing layers have shorter widths than lower layers of the plurality of light condensing layers,
    wherein the light condensing layers of the pixel lens have their sidewalls of one side aligned with each other.

2. The image sensor of claim 1, further comprising:
    a filter layer formed over or under the pixel lens.

3. The image sensor of claim 1, wherein the plurality of light condensing layers have the same shape.

4. The image sensor of claim 3, wherein each of the plurality of light condensing layers is in a polygon shape, in a circle shape, or in an oval shape.

5. The image sensor of claim 1,
    wherein the upper layers of the plurality of light condensing layers of the pixel lens have a shorter width than the lower layers of the plurality of light condensing layers in a direction (which is referred to as 'a first direction', hereafter) toward the aligned sidewalls from centers of the plurality of light condensing layers, and wherein the upper layers of the plurality of light condensing layers of the pixel lens have a shorter width than or the same width as the lower layers of the plurality of light condensing layers in a second direction that intersects with the first direction.

6. The image sensor of claim 1, wherein the lowermost light condensing layer among the plurality of light condensing layers is the same as or greater than the photoelectric conversion layer in width (or area).

7. An image sensor comprising:
a pixel array where a plurality of pixels, including at least a pair of phase difference detection pixels, are arranged,
wherein each of the pair of phase difference detection pixels comprises:
a photoelectric conversion layer; and
a pixel lens, including a plurality of light condensing layers, formed over the photoelectric conversion layer,
wherein upper layers of the plurality of light condensing layers have shorter widths than lower layers of the plurality of light condensing layers,
wherein first sidewalls of the plurality of light condensing layers are aligned with each other,
wherein the pair of the phase difference detection pixels include a first pixel and a second pixel, and
wherein the first pixel and the second pixel are arranged so that the aligned first sidewalls of the plurality of light condensing layers of the first pixel face against the aligned first sidewalls of the plurality of light condensing layers of the second pixel.

8. The image sensor of claim 7, wherein each of the pair of the phase difference detection pixels further comprises:
a filter layer formed over or under the pixel lens.

9. The image sensor of claim 8, wherein the filter layer of the first pixel is the same as the filter layer of the second pixel.

10. The image sensor of claim 7,
wherein the upper layers of the plurality of light condensing layers of the pixel lens have a shorter width than the lower layers of the plurality of light condensing layers in a direction (which is referred to as 'a first direction', hereafter) toward the aligned first sidewalls from centers of the plurality of light condensing layers, and
wherein the upper layers of the plurality of light condensing layers of the pixel lens have a shorter width than or the same width as the lower layers of the plurality of light condensing layers in a second direction that intersects with the first direction.

11. The image sensor of claim 7, wherein second sidewalls of the plurality of light condensing layers form a step structure, and the second sidewalls are located opposite to the first sidewalls.

12. The image sensor of claim 7, wherein the lowermost light condensing layer among the plurality of light condensing layers is the same as or greater than the photoelectric conversion layer in width (or area).

13. The image sensor of claim 7, wherein the first pixel and the second pixel are disposed adjacent to each other or spaced apart from each other, and
wherein the first pixel and the second pixel are disposed in the same row or the same column in the pixel array.

14. The image sensor of claim 7, wherein the first pixel and the second pixel are disposed to be adjacent to each other or spaced apart from each other, and
wherein the first pixel and the second pixel are disposed in different rows or different columns in the pixel array.

15. An image sensor comprising:
a pixel array where a plurality of pixels, including at least a pair of phase difference detection pixels, are arranged,
wherein the pair of the phase difference detection pixels comprises a first pixel and a second pixel, and each of the first pixel and the second pixel comprises:
a photoelectric conversion layer; and
a pixel lens, including a plurality of light condensing layers, formed over the photoelectric conversion layer,
wherein upper layers of the plurality of light condensing layers are shorter in width than lower layers of the plurality of light condensing layers,
wherein the plurality of light condensing layers are disposed in an eccentric manner with respect to each other, and
wherein the first pixel and the second pixel face against each other.

16. The image sensor of claim 15, wherein sidewalls of the plurality of light condensing layers of each of the first and the second pixels are disposed close to each other in a first direction extending from centers of the light condensing layers toward sidewalls of the light condensing layers.

17. An image sensor, comprising:
a first photoelectric conversion layer; and
a first pixel lens, including a first plurality of light condensing layers, formed over the first photoelectric conversion layer,
wherein respective upper layers of the first plurality of light condensing layers are smaller in area than lower layers of the first plurality of light condensing layers, and
wherein first sidewalls of the first plurality of light condensing layers are aligned with each other along a vertical direction perpendicular to an upper surface of the first photoelectric conversion layer.

18. The image sensor of claim 17, further comprising:
a second photoelectric conversion layer; and
a second pixel lens, including a second plurality of light condensing layers, formed over the second photoelectric conversion layer,
wherein upper layers of the second plurality of light condensing layers are smaller in area than lower layers of the second plurality of light condensing layers, and
wherein the second pixel lens and the first pixel lens form a mirror image with respect to each other.

* * * * *